United States Patent [19]

McCartney et al.

[11] Patent Number: 5,027,285

[45] Date of Patent: Jun. 25, 1991

[54] POWER LINE WAVEFORM MEASUREMENT SYSTEM

[75] Inventors: Andrew McCartney, Libertyville; Charles DeWitt, Park Ridge; William Elliott, Hawthorn Woods, all of Ill.

[73] Assignee: Oneac Corporation, Libertyville, Ill.

[21] Appl. No.: 316,936

[22] Filed: Feb. 28, 1989

[51] Int. Cl.$^5$ ............................................. G06F 15/56
[52] U.S. Cl. .................................. 364/483; 324/103 P; 324/500; 340/660; 364/487
[58] Field of Search ............... 364/480, 481, 483, 492, 364/487; 324/103 R, 103 P, 500, 112, 102; 340/657, 660, 661, 662, 663

[56] References Cited

U.S. PATENT DOCUMENTS

| | | | |
|---|---|---|---|
| 4,156,280 | 5/1979 | Griess | 364/481 |
| 4,187,461 | 2/1980 | Cox | 324/102 |
| 4,206,413 | 6/1980 | Cox et al. | 324/102 |
| 4,414,638 | 11/1983 | Talambiras | 364/571 |
| 4,414,639 | 11/1983 | Talambiras | 364/602 |
| 4,484,290 | 11/1984 | Bagnall et al. | 364/483 |
| 4,589,052 | 5/1986 | Dougherty | 364/483 |
| 4,612,617 | 9/1986 | Laplace, Jr. et al. | 364/483 |
| 4,642,563 | 2/1987 | McEachern et al. | 324/111 |
| 4,672,555 | 6/1987 | Hart et al. | 364/483 |
| 4,694,402 | 9/1987 | McEachern et al. | 364/487 |
| 4,723,220 | 2/1988 | Smith-Vaniz | 364/492 |
| 4,845,594 | 7/1989 | Wilkerson | 364/483 |
| 4,884,021 | 11/1989 | Hammond et al. | 364/483 |

FOREIGN PATENT DOCUMENTS

| | | |
|---|---|---|
| 0023708 | 2/1981 | European Pat. Off. |
| 0064814 | 11/1982 | European Pat. Off. |
| 2095932 | 10/1982 | United Kingdom |

OTHER PUBLICATIONS

"Window Comparator Provides Hysteresis"; EDN; Aug. 23, 1984; pp. 240, 242.

Primary Examiner—Kevin J. Teska
Attorney, Agent, or Firm—Mason, Kolehmainen, Rathburn & Wyss

[57] ABSTRACT

An AC waveform monitoring system includes detecting circuitry for providing a sensed analog signal. Oscillator circuitry is coupled to the detecting circuitry for providing a zero crossing signal. The oscillator circuitry is synchronized with a frequency of the sensed analog signal. Signal processing circuitry is coupled to both the detecting circuitry and the oscillator circuitry for identifying a peak voltage signal and an integral volt-seconds signal of the sensed analog signal responsive to the zero crossing signal. Digital processing circuitry is coupled to the signal processing circuitry and the oscillator circuitry. The digital processing circuitry includes memory for storing a plurality of predetermined signal voltage boundary values and a program utilizing the identified peak voltage signal, the integral volt-seconds signal and the stored predetermined signal values to identify an abnormal voltage event.

17 Claims, 2 Drawing Sheets

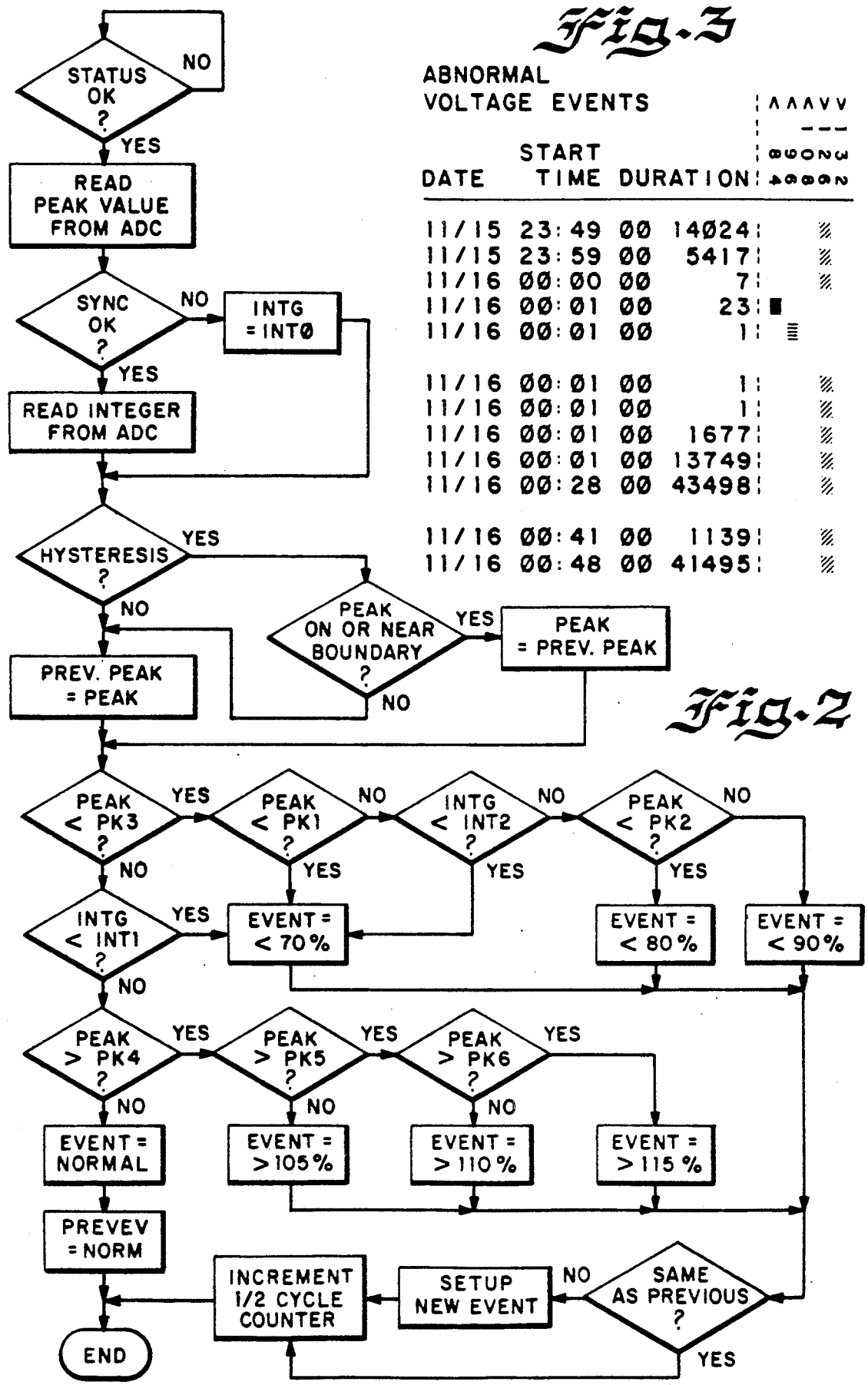

POWER LINE WAVEFORM MEASUREMENT SYSTEM

RELATED APPLICATION

A related application is entitled "LINE NOISE SIGNAL MEASUREMENT SYSTEM USING ANALOG SIGNAL COMPRESSION WITH DIGITAL LINEARITY CORRECTION," U.S. Pat. No. 4,940,947 filed Feb. 28, 1989, the same date as the present application by Andrew McCartney et al. and assigned to the same assignee.

FIELD OF THE INVENTION

The present invention relates generally to AC (alternating current) waveform measurement systems, and more particularly to an AC waveform monitoring system for detecting and recording abnormal voltage events.

DESCRIPTION OF THE PRIOR ART

Various detectors are known for detecting disturbances on AC power lines. Disadvantages of known arrangements generally include the complexity and the resulting expense of the circuitry utilized. Further the recorded information provided by many known arrangements results in an extremely extensive amount of data that is difficult to analyze.

It is desirable to provide an improved AC waveform monitoring system for detecting and recording an abnormal voltage events graph to facilitate easy analysis by the user. It is desirable to provide such a system capable of detecting abnormal voltage conditions that could adversely affect the operation of various known linear and switching power supplies without providing extensive amounts of unnecessary data.

SUMMARY OF THE INVENTION

A principal object of the present invention is to provide an improved AC waveform monitoring system that overcomes many of the disadvantages of the prior art systems.

It is another object of the present invention to provide an improved AC waveform monitoring system utilizing a one-half cycle period for recording abnormal voltage events.

It is another object of the present invention to provide an improved AC waveform monitoring system including digital processing circuitry with memory for storing a plurality of predetermined boundary signal values used for identifying abnormal voltage events.

In brief, the objects and advantages of the present invention are achieved by an AC waveform monitoring system comprising detecting circuitry for providing a sensed analog signal. Oscillator circuitry is coupled to the detecting circuitry for providing a zero crossing signal. The oscillator circuitry is synchronized with a frequency of the sensed analog signal. Signal processing circuitry is coupled to both the detecting circuitry and the oscillator circuitry for identifying a peak voltage signal of the sensed analog signal responsive to the zero crossing signal. Digital processing circuitry is coupled to the signal processing circuitry and the oscillator circuitry. The digital processing circuitry includes memory for storing a plurality of predetermined signal values and a program utilizing the peak voltage signal and the stored predetermined signal values for identifying the presence of one of a plurality of predefined abnormal voltage events responsive to the zero crossing signal.

BRIEF DESCRIPTION OF THE DRAWINGS

The present invention together with the above and other objects and advantages may best be understood from the following detailed description of the embodiment of the invention illustrated in the drawings, wherein:

FIG. 2 is a flow chart illustrating the logical steps performed by the system of FIG. 1; and FIG. 3 is an exemplary chart illustrating an abnormal voltage events display of the system of FIG. 1.

DETAILED DESCRIPTION OF THE PREFERRED EMBODIMENT

Figure 1:
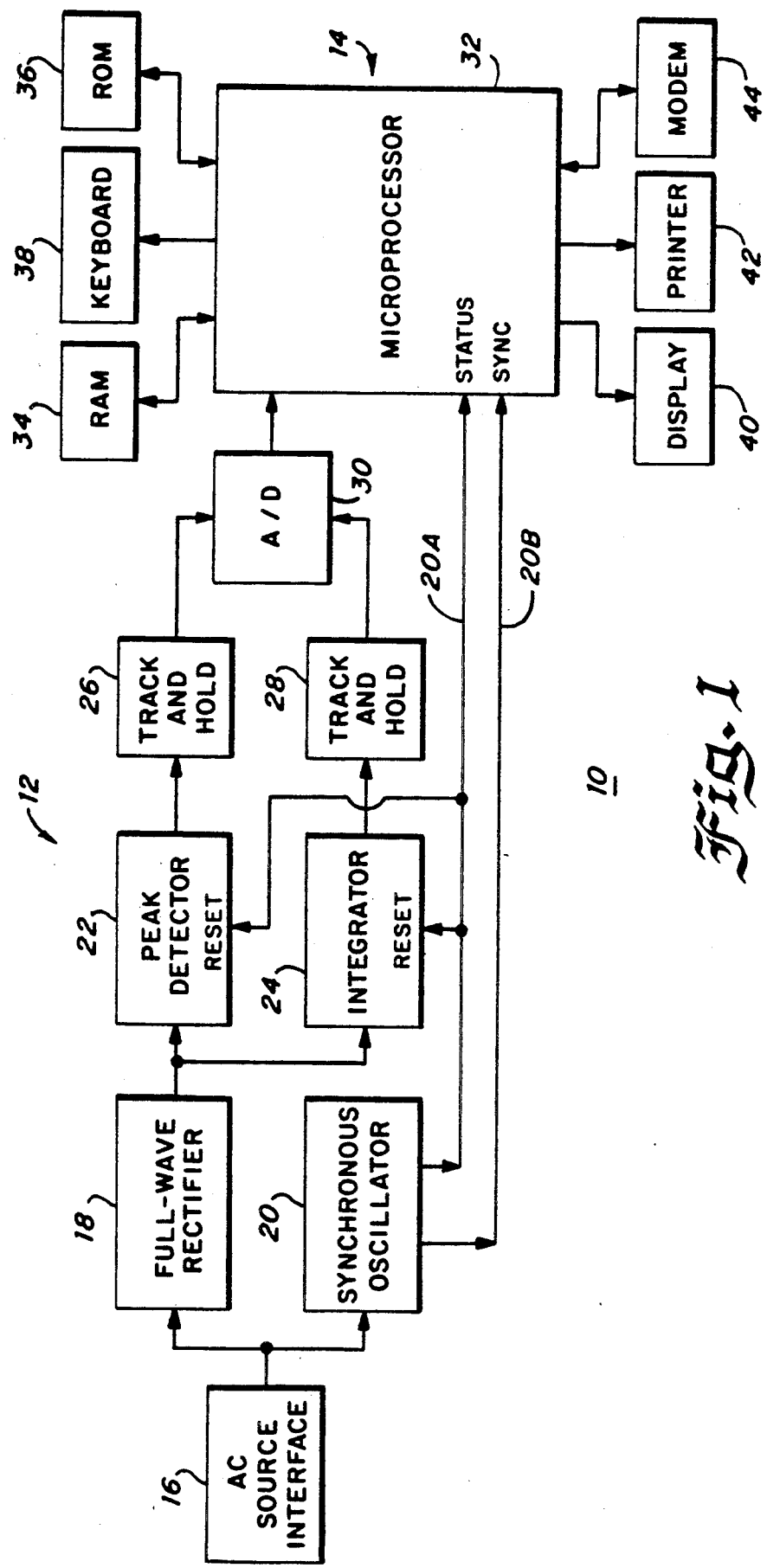
FIG. 1 is a block diagram representation of an AC waveform monitoring system in accordance with the principles of the present invention.

Referring now to the drawings, in FIG. 1 there is illustrated an AC waveform monitoring system for detecting and recording abnormal voltage events according to the present invention generally designated by the reference character 10. As its major functional components, the AC power line monitoring system 10 includes an analog signal detecting and processing circuit generally designated by the reference character 12 and a digital signal processing circuit generally designated by the reference character 14.

In accordance with the feature of the present invention, the analog signal detecting and processing circuit 12 and the digital signal processing circuit 14 utilize a one half cycle period for recording an abnormal voltage event. During each half cycle the analog signal detecting and processing circuit 12 provides both a peak voltage magnitude signal and a volt-seconds integral signal of the monitored AC voltage source. Digital processing of the identified signals is then performed by the digital processing circuit 14 for identifying an abnormal voltage event for each half cycle and for generating an abnormal voltage events record for the user of the system 10.

The analog signal detecting and processing circuit 12 includes an AC source interface circuit connected to the AC power source being monitored for providing isolation and a reduced amplitude sensed signal for further analog signal processing. An attenuation factor of the AC source interface circuit is selected for providing the sensed output signal with an amplitude in a range, for example, between plus and minus 5 volts.

A full-wave rectifier circuit 18 and a synchronous oscillator circuit 20 is connected to the AC source interface circuit 16 for receiving the sensed output signal of the interface circuit. A zero crossing signal shown at line 20A is provided by the synchronous oscillator circuit 20 that is normally synchronized with the sensed signal. During a complete power outage of the monitored AC source, the synchronous oscillator circuit 20 continues to oscillate and provide a zero crossing signal. Following a power outage until normal synchronous operation of the oscillator circuit 20 with the sensed signal is achieved, a control signal shown at a line 20B is provided by synchronous oscillator circuit 20 representative of the then nonsynchronous operation.

Identical gain values for the positive and negative half cycles are provided by the full-wave rectifier circuit 18. A full-wave rectified sensed signal provided by the rectifier circuit 18 is applied to both a peak detector circuit 22 and an integrator circuit 24. The zero crossing signal provided by the synchronous oscillator circuit 20 at line 20A is applied to a reset input of both the peak detector circuit 22 and the integrator circuit 24.

The peak detector circuit 22 provides a peak voltage signal of the rectified sensed signal for every half cycle independent of the previous half cycle. The integrator circuit 24 provides a volt-seconds area or integral signal representing the integral of the rectified sensed signal for each half cycle. The output signal of the peak detector circuit 22 is applied to a track and hold circuit 26 and the output signal of the integrator circuit 24 is applied to a track and hold circuit 28. The track and hold circuits 26 and 28 hold the applied signals for one-half cycle and are connected to an analog to digital (A/D) converter 30 for providing analog to digital conversion of the peak and integral voltage signals. An 8-bit analog to digital converter, such as an ADC0809 manufactured by National Semiconductor Corp. or various other commercially available devices can be used for the A/D converter 30.

Digital processing circuit 14 includes a microprocessor 32 operatively connected to the A/D converter 30 for reading the measured peak and integral values from the A/D Converter 30 for each prior half cycle. The zero crossing signal and control signal shown at the lines 20A and 20B are applied to status and synchronization inputs of the microprocessor 32 from the synchronous oscillator circuit 20. An 8-bit data, 16-bit address microprocessor, such as a device type Z80 microprocessor manufactured by Zilog Corp., can be utilized for the microprocessor 22, although a variety of commercially available microprocessors having standard capabilities could be used.

A random access memory (RAM) 34 and a read only memory (ROM) 36 are associated with the microprocessor 32 for storing identified abnormal voltage event data, system parameter data and a system program of the present invention. A keyboard 38 and a display 40 can be coupled to the microprocessor 32 to facilitate receiving programmable boundary parameter data, such as a nominal peak voltage value and corresponding peak voltage boundary values and volt-seconds integral values, and for displaying selected system indications. A printer 42 is coupled to the microprocessor 32 for recording the abnormal voltage event data. A modem 44 can be coupled to the microprocessor 32 to facilitate transmission of the identified abnormal voltage event data for recording and display at a remote location.

Referring now to FIG. 2, there is shown a flow chart illustrating the logical steps performed under program control by the microprocessor 32 for identifying abnormal voltage events during each half cycle. Each half cycle event evaluation sequence begins with the microprocessor 32 performing a status bit check to determine whether new half cycle data is available in the A/D Converter 30. The status bit is set in response to the zero crossing signal at line 20A applied to the microprocessor STATUS port. When the status bit is set, then the microprocessor 32 reads the peak value from the A/D Converter 30 and resets the status bit. Next the microprocessor 32 performs a synchronization check by reading the microprocessor SYNC port signal to determine whether the oscillator 20 is synchronized with the sensed AC signal. When the microprocessor SYNC port signal is high indicating that the oscillator circuit 20 is not synchronized with the sensed AC signal, then a default value INT0 is set equal to the measured integrator value INTG. Otherwise when the microprocessor SYNC port signal is low indicating that the oscillator 20 is synchronized with the sensed AC signal, then the microprocessor 32 reads the measured integrator value from the A/D Converter 30.

Next it is determined whether hysteresis checking is required. Whether or not hysteresis checking is required is determined by identifying the current value of a variable PBOUND that represents an identified window boundary (PK1-PK6) from the immediately prior half cycle evaluation routine. When a window boundary was not identified by the immediately prior half cycle evaluation, then PBOUND is equal to zero and hysteresis checking is not required. Otherwise, when PBOUND is non-zero, then a hysteresis subroutine is performed. The hysteresis subroutine begins by comparing the current PEAK value with the previous boundary value PBOUND. If the present PEAK value is within a predetermined ±/− value of the previous PBOUND value then the current PEAK value is replaced by the previous half cycle PREVPK value. Otherwise when the present PEAK value is not on or near the previous boundary value PBOUND, then PBOUND When hysteresis checking is not required or after PBOUND is set to zero in the hysteresis checking subroutine, then the previous half cycle PREVPK value is set equal to the current PEAK value read from A/D converter 30. Next the PEAK value is first compared with a stored boundary value PK3, where PK3 is equal to 10% less than a nominal peak voltage value, for example, 108 volts for a nominal 120 volts peak voltage value. When it is determined when the present PEAK value is less than PK3, then the present PEAK value is compared with a stored boundary value PK1, where PK1 is a boundary value of 30% below a nominal value, such as 84 volts for a 120 volt nominal peak voltage. When it is determined that the present PEAK value is less than the PK1 value, then an abnormal event is identified of less than 70%. Then it is determined if the previous event identified during the prior half cycle evaluation was the same as the present identified less than 70% event. When the previous half cycle event was not the same, then the identified <70% event is stored with new event storage areas allocated in the RAM 34 including a <70% event type, date, time and a <70% event counter storage area. Then the <70% event counter is incremented by 1 and the half cycle event evaluation process ends. Otherwise, if the previous event identified for the prior half cycle was also a less than 70% event, then previously allocated <70% event counter is incremented and the half cycle event evaluation routine is completed.

Otherwise when the present PEAK value is greater than or equal to PK1, then the present INTG value is compared with a stored INT2 value. If the present INTG value is less than a stored INT2 value then the event is identified as a less than 70% event and the sequential steps are repeated to determine if the prior event was the same or a new event storage area is required. Otherwise when the present INTG value is greater than or equal to the stored INT2 value, then the PEAK value is compared to a stored PK2 value that equals a boundary value of 20% less than the nominal voltage value, such as 96 volts. If the PEAK value is less than the PK2 value, then a less than 80% event is identified. Otherwise when the PEAK value is greater than or equal to the stored PK2 value, than a 90% event is identified. Then sequential steps continue by comparing the particular identified event with the previous identified event to complete the half cycle event evaluation routine.

When it is determined that the PEAK value is greater than or equal to the stored PK3 (−10% of nominal value), then the present INTG value is compared with a stored INT1 value. When determined when the INTG value is less than the stored INT1 value, then an event of less than 70% is identified. Then the prior event comparison sequential steps are performed as described above to complete the half cycle event evaluation routine.

Otherwise when the present INTG value is greater than or equal to the stored INT1 value, then the PEAK value is compared with a stored PK4 value that is equal to a 5% above the nominal voltage boundary, such as 126 volts. When the PEAK value is greater than the stored PK4 value, then it is compared with the stored PK5 value that is equal to 10% above the nominal value, such as 132 volts. When it is determined that the PEAK value is less than or equal to the stored PK5 value than a greater than 105% event is identified.

When determined that the PEAK value is greater than the stored PK5 value, then it is compared to the stored PK6 value equal to 15% above the nominal value, such as 138 volts. When it is determined that the PEAK value is greater than the stored PK6 value, than a 115% event is identified. Otherwise if it s determined that the PEAK value is less than or equal to the PK6 value then a greater than 110% event is identified.

After a particular event is identified, then the identified event is compared with the previous identified event as described above to complete the event evaluation routine.

When the PEAK value is less than the stored PK4 value, then a normal event is identified. Then the previous event evaluated PREVEV variable is set equal to normal to complete the half cycle event evaluation routine.

Referring now to FIG. 3, there is shown an exemplary printed abnormal voltage event graph of the AC power line waveform monitoring system 10. A plurality of graphic symbols are printed representing each identified abnormal voltage event relative to the vertical axis together with date, starting time, an identified number of half cycles duration value provided along the horizontal axis. Thus the printed graph simply and effectively reports abnormal voltage events for an extended period of time to facilitate easy analysis by the user.

While the invention has been described with reference to details of the illustrated embodiment, these details are not intended to limit the scope of the invention as defined in the appended claims.

What is claimed is:

1. An AC waveform monitoring system comprising:
   detecting means for providing a sensed analog signal;
   oscillator means coupled to said detecting means for generating a zero crossing signal; said oscillator means including means for synchronizing said zero crossing signal with a frequency of said sensed analog signal and means for generating a control signal representing nonsynchronous operation with said generated zero crossing signal during a power outage;
   signal processing means coupled to both said detecting means and said oscillator means for identifying a peak voltage value of said sensed analog signal responsive to said zero crossing signal, said signal processing means including voltage integrating means for identifying an integral volt-seconds value of said sensed analog signal responsive to said zero crossing signal; and
   digital processing means coupled to said signal processing means and said oscillator means for receiving said identified peak voltage value and said identified integral volt-second value, said digital processing means including memory means for storing a plurality of predetermined voltage boundary signal values; and program means utilizing said received peak voltage value, said received integral volt-second value and said stored predetermined signal values responsive to said zero crossing signal for identifying the presence of one of a plurality of predefined abnormal voltage events.

2. An AC waveform monitoring system as recited in claim 1 wherein said digital processing means further is adapted for receiving said generated control signal and wherein said program means replaces said identified integral volt-seconds value with a stored default integral volt-seconds value responsive to said received control signal.

3. An AC waveform monitoring system as recited in claim 1 wherein said program means selectively compares said peak voltage signal and said integral volt-seconds value with a predefined sequence of at least one of said stored predetermined signal values for identifying the presence of one of a plurality of predefined abnormal voltage events.

4. An AC waveform monitoring system as recited in claim 1 wherein said program means provided hysteresis correction of said identified peak voltage value.

5. An AC waveform monitoring system as recited in claim 1 wherein said digital processing means further include means for identifying a time and date value for storing with said identified abnormal voltage event.

6. An AC waveform monitoring system as recited in claim 1 wherein said program means counts successive ones of each identified predefined abnormal event and stores a count value for said predefined abnormal event.

7. An AC waveform monitoring system as recited in claim 1 wherein said digital processing means further include means responsive to said program means for generating a display, said display including said identified abnormal voltage events.

8. An AC waveform monitoring system as recited in claim 1 wherein said digital processing means further include means for identifying a time and date value for storing with each said identified abnormal voltage event and means responsive to said program means for generating a display, said display including said identified abnormal voltage events with said time and date value.

9. An AC waveform monitoring system as recited in claim 8 wherein said program means counts successive ones of each identified predefined abnormal event and storing a count value, and said display including each said identified abnormal voltage event with said time and date value and said count value.

10. An AC waveform monitoring system comprising:
    detecting means for providing a sensed analog signal;
    oscillator means coupled to said detecting means for generating a zero crossing signal; said oscillator means including means for synchronizing said zero crossing signal with a frequency of said sensed analog signal and means for generating a control signal representing nonsynchronous operation with said generated zero crossing signal during a power outage;

signal processing means coupled to both said detecting means and said oscillator means for identifying a peak voltage value of said sensed analog signal responsive to said zero crossing signal, said signal processing means including voltage integrating means for identifying an integral volt-seconds value of said sensed analog signal responsive to said zero crossing signal; and digital processing means coupled to said signal processing means and said oscillator means for receiving said identified peak voltage value and said identified integral volt-second value, said digital processing means including memory means for storing a plurality of predetermined voltage boundary signal values; and program means for providing hysteresis correction of said identified peak voltage value and utilizing said hysteresis corrected peak voltage value, said identified integral volt-seconds value and said stored predetermined signal values responsive to said zero crossing signal for identifying the presence of one of a plurality of predefined abnormal voltage events.

11. An AC waveform monitoring system as recited in claim 10 wherein said digital processing means further is adapted for receiving said generated control signal and wherein said program means replaces said identified integral volt-seconds value with a stored default integral volt-seconds value responsive to said received control signal.

12. An AC waveform monitoring system as recited in claim 10 wherein said program means selectively compare said peak voltage signal and said integral volt-seconds value with a predefined sequence of at least one of said stored predetermined signal values for identifying the presence of one of a plurality of predefined abnormal voltage events.

13. An AC waveform monitoring system as recited in claim 10 wherein said digital processing means further include means responsive to said program means for identifying a time and date value for storing with said identified abnormal voltage event.

14. An AC waveform monitoring system as recited in claim 10 wherein said digital processing means further include means responsive to said program means for generating a display, said display including said identified abnormal voltage events.

15. An AC waveform monitoring system as recited in claim 10 wherein said digital processing means further include means responsive to said program means for identifying a time and date value for storing with said identified abnormal voltage event and means responsive to said program means for generating a display, said display including said identified abnormal voltage events with said time and date value.

16. An AC waveform monitoring system as recited in claim 10 wherein said digital processing means further include means responsive to said program means for identifying a time and date value for storing with said identified abnormal voltage event, means identifying a count value corresponding to successively identified ones of one predefined abnormal event, and means responsive to said program means for generating a display, said display including said identified abnormal voltage events with said time and date value and said count value.

17. An AC waveform monitoring system comprising:
detecting means for providing a sensed analog signal;
oscillator means coupled to said detecting means for generating a zero crossing signal; said oscillator means including means for synchronizing said zero crossing signal with a frequency of said sensed analog signal and means for generating a control signal representing nonsynchronous operation with said generated zero crossing signal during a power outage;

signal processing means coupled to both said detecting means and said oscillator means for identifying a peak voltage value of said sensed analog signal responsive to said zero crossing signal; said signal processing means including voltage integrating means for identifying an integral volt-seconds value of said sensed analog signal responsive to said zero crossing signal; and digital processing means coupled to said signal processing means and said oscillator means for receiving said identified peak voltage value and said identified integral volt-second value, said digital processing means including memory means for storing a plurality of predetermined voltage boundary signal values; program means utilizing said identified peak voltage value, said identified integral volt-seconds value and said stored predetermined signal values responsive to said zero crossing signal for identifying the presence of one of a plurality of predefined abnormal voltage events; means for identifying a time and date value for storing with said identified abnormal voltage event and means responsive to said program mean for generating a display, said display including said identified abnormal voltage events with said real time and date value.

* * * * *